United States Patent
Capasso et al.

(10) Patent No.: US 6,816,530 B2
(45) Date of Patent: Nov. 9, 2004

(54) NONLINEAR SEMICONDUCTOR LIGHT SOURCES

(75) Inventors: Federico Capasso, Westfield, NJ (US); Alfred Yi Cho, Summit, NJ (US); Raffaele Colombelli, Hoboken, NJ (US); Claire F Gmachl, New Providence, NJ (US); Nina Owschimikow, New Providence, NJ (US); Deborah Lee Sivco, Warren, NJ (US)

(73) Assignee: Lucent Technologies Inc., Murrray Hill, NJ (US)

( * ) Notice: Subject to any disclaimer, the term of this patent is extended or adjusted under 35 U.S.C. 154(b) by 0 days.

(21) Appl. No.: 10/261,423

(22) Filed: Sep. 30, 2002

(65) Prior Publication Data

US 2004/0066823 A1 Apr. 8, 2004

(51) Int. Cl.[7] .............................. H01S 3/10; H01S 5/00; H01S 3/08

(52) U.S. Cl. ............................. 372/50; 372/21; 372/22; 372/44; 372/45; 372/92

(58) Field of Search ............................. 372/21, 22, 44, 372/45, 50, 92, 28, 38.05

(56) References Cited

U.S. PATENT DOCUMENTS 5,341,390 A * 8/1994 Yamada et al. ................ 372/45
5,345,456 A * 9/1994 Dai et al. ...................... 372/22

FOREIGN PATENT DOCUMENTS

JP 06187014 * 2/1996

OTHER PUBLICATIONS

Owschimikow, N., et al., "Resonant Second–Order Nonlinear Optical Processes in Quantum Cascade Lasers," Physical Review Letters, vol. 90, No. 4, pp. 043902–1 to 043902–4, Jan. 31, 2003.

Harris, S.E., et al., "Subfemtosecond Pulse Generation by Molecular Modulation," Physical Review Letters, vol. 81, No. 14, pp. 2894–2897, Oct. 5, 1998.

Saba, M., et al., "High–temperature ultrafast polariton parametric amplification in semiconductor microcavities," Nature, vol. 414, pp. 731–735, Dec. 13, 2001.

Gisin, N., et al., "Quantum cryptography," Review of Modern Physics, vol. 74, pp. 145–195, Mar. 8, 2002.

Resch, K.J., et al., "Nonlinear Optics with Less Than One Photon," Phys. Rev. Lett., vol. 87, No. 12, pp. 123603–1 to 123603–4, 2001.

Gmachl, C., et al., "Recent progress in quantum cascade lasers and applications," Rep. Prog. Phys., vol. 64, No. 9, pp. 1533–1601, 2001.

Gurnick, M.K., "Synthetic Nonlinear Semiconductors," IEEE, J. Quantum Electron., vol. 19, No. 5, pp. 791–794, 1983.

(List continued on next page.)

Primary Examiner—Don Wong
Assistant Examiner—Armando Rodriguez
(74) Attorney, Agent, or Firm—John F. McCabe

(57) ABSTRACT

A monolithic apparatus has a laser optical cavity. The laser optical cavity has a multi-layer structure that includes a first active semiconductor multi-layer and a second semiconductor multi-layer. The second semiconductor multi-layer is located laterally adjacent to the first active semiconductor multi-layer. The first active semiconductor multi-layer includes a sequence of quantum well structures that produce light of a lasing frequency in response to being electrically pumped. The second semiconductor multi-layer includes a sequence of quantum well structures and is configured to both absorb light of the lasing frequency and produce one of parametric light and harmonic light in response to absorbing light of the lasing frequency.

19 Claims, 21 Drawing Sheets

OTHER PUBLICATIONS

Fejer, M.M., et al., "*Observation of Extremely Large Quadratic Susceptiblity at 9.6–10.8μm in Electric–Field–Biased AlGaAs Quantum Wells,*" Phys. Rev. Lett., vol. 62, No. 9, pp. 1041–1044, 1989.

Capasso, F., et al., "*Coupled Quantum Well Semiconductors with Giant Electric Field Tunable Nonlinear Optical Properties in the Infrared,*" IEEE J. Quantum Electron., vol. 30, No. 5, pp. 1313–1326, 1994.

Shaw, M.J., et al., "*Second–harmonic generation in p–type asymmetric GaAs–Al Ga$_1$–As–AlAs superlattices due to excitations between valence minibands,*" Phys. Rev., vol. B 50, No. 24, pp. 18 395–18 419, 1994.

Liu, H.C., et al., "*Sum Frequency Generation by Intersubband Transition in Step Quantum Wells,*" IEEE J Quantum Electronics, vol. 31, No. 9, pp. 1659–1662, 1995.

Rosencher, E., et al., "*Quantum Engineering of Optical Nonlinearities,*" Science, vol. 271, pp. 168–173, Jan. 12, 1996.

Belyanin, A.A., "*Infrared generation in low–dimensional semiconductor heterostructures via quantum coherence,*" Phys. Rev. vol. A 63, pp. 053803–1 to 053803–8, 2001.

Gmachl, C., et al., "*Quantum cascade lasers with a heterogeneous cascade: Two–wavelength operation,*" Appl. Phys. Lett., vol. 79, No. 5, pp. 572–574, 2001.

Grahn, H.T., et al., "*Electric–Field Domains in Semiconductor Superlattices: A Novel System for Tunneling between 2D Systems,*" Phys. Rev. Lett., vol. 67, No. 12, pp. 1618–1621, 1991.

Tredicucci, A., et al., "*A multiwavelength semiconductor laser,*" Nature, vol. 396, pp. 350–353, 1998.

\* cited by examiner

FIG. 3A

| LAYER ID | DOPANT TYPE | SEMICONDUCTOR TYPE | Si DOPANT CONCENTRATION | THICKNESS |
|---|---|---|---|---|
| A | n++ | GaInAs (top) | $1 \times 10^{20}$ cm$^{-3}$ | 100 Å |
| B | n | GaInAs | $6 \times 10^{18}$ cm$^{-3}$ | 5000 Å |
| C | n | $Ga_{0.5x}Al_{0.5(1-x)}$InAs(graded) | $2 \times 10^{17}$ cm$^{-3}$ | 250 Å |
| D | n | AlInAs | $2 \times 10^{17}$ cm$^{-3}$ | 10000 Å |
| E | n | AlInAs | $1 \times 10^{17}$ cm$^{-3}$ | 28000 Å |
| F | n | $Ga_{0.5x}Al_{0.5(1-x)}$InAs(graded) | $1 \times 10^{17}$ cm$^{-3}$ | 250 Å |
| G | n | GaInAs | $3 \times 10^{16}$ cm$^{-3}$ | 2000 Å |
| H | i | top injector |  | 245 Å |
| I | n | 19 x active regions and injectors | $2 \times 10^{17}$ cm$^{-3}$ | 501 Å |
| J | n | bottom injector | $2 \times 10^{17}$ cm$^{-3}$ | 173 Å |
| K | n | GaInAs | $5 \times 10^{16}$ cm$^{-3}$ | 250 Å |
| L | n | $Ga_{0.5x}Al_{0.5(1-x)}$InAs(graded) | $3 \times 10^{16}$ cm$^{-3}$ | 326 Å |
| M | n | 9 x intermediate superlattice layers | $3 \times 10^{16}$ cm$^{-3}$ | 239 Å |
| N | n | $Ga_{0.5x}Al_{0.5(1-x)}$InAs(graded) | $3 \times 10^{16}$ cm$^{-3}$ | 256 Å |
| O | n | GaInAs | $5 \times 10^{16}$ cm$^{-3}$ | 250 Å |
| P | n | top injector | $1 \times 10^{17}$ cm$^{-3}$ | 139 Å |
| Q | n | 16 x active regions and injectors | $3 \times 10^{17}$ cm$^{-3}$ | 471 Å |
| R | n | bottom injector | $1 \times 10^{17}$ cm$^{-3}$ | 150 Å |
| S | n | GaInAs | $5 \times 10^{16}$ cm$^{-3}$ | 5000 Å |
| T | n | $Ga_{0.5x}Al_{0.5(1-x)}$InAs(graded) | $5 \times 10^{16}$ cm$^{-3}$ | 250 Å |
| U | n | InP substrate (bottom) | $1-4 \; 10^{17}$ cm$^{-3}$ | full wafer |

FIG. 3B

| DOPANT TYPE | SEMICONDUCTOR TYPE | Si DOPANT CONCENTRATION | THICKNESS |
|---|---|---|---|
| n | AlInAs (top) | $2\times10^{17}$ cm$^{-3}$ | 8 Å |
| n | GaInAs | $2\times10^{17}$ cm$^{-3}$ | 42 Å |
| n | AlInAs | $2\times10^{17}$ cm$^{-3}$ | 16 Å |
| n | GaInAs | $2\times10^{17}$ cm$^{-3}$ | 34 Å |
| n | AlInAs | $2\times10^{17}$ cm$^{-3}$ | 25 Å |
| n | GaInAs | $2\times10^{17}$ cm$^{-3}$ | 25 Å |
| n | AlInAs | $2\times10^{17}$ cm$^{-3}$ | 34 Å |
| n | GaInAs | $2\times10^{17}$ cm$^{-3}$ | 16 Å |
| n | AlInAs | $2\times10^{17}$ cm$^{-3}$ | 42 Å |
| n | GaInAs (bottom) | $2\times10^{17}$ cm$^{-3}$ | 8 Å |

FIG. 3C

| DOPANT TYPE | SEMICONDUCTOR TYPE | Si DOPANT CONCENTRATIONS | THICKNESS |
|---|---|---|---|
| n | GaInAs (top) | $1\times10^{17}$ cm$^{-3}$ | 8 Å |
| n | AlInAs | $1\times10^{17}$ cm$^{-3}$ | 42 Å |
| n | GaInAs | $1\times10^{17}$ cm$^{-3}$ | 16 Å |
| n | AlInAs | $1\times10^{17}$ cm$^{-3}$ | 34 Å |
| n | GaInAs | $1\times10^{17}$ cm$^{-3}$ | 25 Å |
| n | AlInAs | $1\times10^{17}$ cm$^{-3}$ | 25 Å |
| n | GaInAs | $1\times10^{17}$ cm$^{-3}$ | 34 Å |
| n | AlInAs | $1\times10^{17}$ cm$^{-3}$ | 16 Å |
| n | GaInAs | $1\times10^{17}$ cm$^{-3}$ | 42 Å |
| n | AlInAs (bottom) | $1\times10^{17}$ cm$^{-3}$ | 8 Å |

FIG. 3D

| DOPANT TYPE | SEMICONDUCTOR TYPE | THICKNESS |
|---|---|---|
| i | AlInAs (top) | 6 Å |
| i | GaInAs | 57 Å |
| i | AlInAs | 12 Å |
| i | GaInAs | 78 Å |
| i | AlInAs | 10 Å |
| i | GaInAs | 61 Å |
| i | AlInAs (bottom) | 28 Å |

FIG. 3E

| DOPANT TYPE | SEMICONDUCTOR TYPE | Si DOPANT CONCENTRATION | THICKNESS |
|---|---|---|---|
| i | GaInAs (top) | | 48 Å |
| i | AlInAs | | 18 Å |
| n | GaInAs | $2 \times 10^{17}$ cm$^{-3}$ | 43 Å |
| n | AlInAs | $2 \times 10^{17}$ cm$^{-3}$ | 14 Å |
| n | GaInAs | $2 \times 10^{17}$ cm$^{-3}$ | 38 Å |
| i | AlInAs | | 12 Å |
| i | GaInAs | | 34 Å |
| i | AlInAs | | 9 Å |
| i | GaInAs | | 33 Å |
| i | AlInAs | | 36 Å |
| i | GaInAs | | 27 Å |
| i | AlInAs | | 12 Å |
| i | GaInAs | | 78 Å |
| i | AlInAs | | 10 Å |
| i | GaInAs | | 61 Å |
| i | AlInAs (bottom) | | 28 Å |

FIG. 3F

| DOPANT TYPE | SEMICONDUCTOR TYPE | Si DOPANT CONCENTRATION | THICKNESS |
|---|---|---|---|
| i | GaInAs (top) | | 48 Å |
| i | AlInAs | | 18 Å |
| n | GaInAs | $2 \times 10^{17}$ cm$^{-3}$ | 43 Å |
| n | AlInAs | $2 \times 10^{17}$ cm$^{-3}$ | 14 Å |
| n | GaInAs | $2 \times 10^{17}$ cm$^{-3}$ | 38 Å |
| i | AlInAs (bottom) | | 12 Å |

FIG. 3G

| DOPANT TYPE | SEMICONDUCTOR TYPE | Si DOPANT CONCENTRATION | THICKNESS |
|---|---|---|---|
| n | AlInAs (top) | $3 \times 10^{16}$ cm$^{-3}$ | 6 Å |
| n | GaInAs | $3 \times 10^{16}$ cm$^{-3}$ | 58 Å |
| n | AlInAs | $3 \times 10^{16}$ cm$^{-3}$ | 12 Å |
| n | GaInAs | $3 \times 10^{16}$ cm$^{-3}$ | 52 Å |
| n | AlInAs | $3 \times 10^{16}$ cm$^{-3}$ | 18 Å |
| n | GaInAs | $3 \times 10^{16}$ cm$^{-3}$ | 46 Å |
| n | AlInAs | $3 \times 10^{16}$ cm$^{-3}$ | 23 Å |
| n | GaInAs | $3 \times 10^{16}$ cm$^{-3}$ | 41 Å |
| n | AlInAs | $3 \times 10^{16}$ cm$^{-3}$ | 23 Å |
| n | GaInAs | $3 \times 10^{16}$ cm$^{-3}$ | 24 Å |
| n | AlInAs (bottom) | $3 \times 10^{16}$ cm$^{-3}$ | 23 Å |

FIG. 3H

| DOPANT TYPE | SEMICONDUCTOR TYPE | Si DOPANT CONCENTRATION | THICKNESS |
|---|---|---|---|
| n | GaInAs (top) | $3\times10^{16}$ cm$^{-3}$ | 41 Å |
| n | AlInAs | $3\times10^{16}$ cm$^{-3}$ | 23 Å |
| n | GaInAs | $3\times10^{16}$ cm$^{-3}$ | 41 Å |
| n | AlInAs | $3\times10^{16}$ cm$^{-3}$ | 23 Å |
| n | GaInAs | $3\times10^{16}$ cm$^{-3}$ | 41 Å |
| n | AlInAs | $3\times10^{16}$ cm$^{-3}$ | 23 Å |
| n | GaInAs | $3\times10^{16}$ cm$^{-3}$ | 24 Å |
| n | AlInAs (bottom) | $3\times10^{16}$ cm$^{-3}$ | 23 Å |

FIG. 3I

| DOPANT TYPE | SEMICONDUCTOR TYPE | Si DOPANT CONCENTRATION | THICKNESS |
|---|---|---|---|
| n | GaInAs (top) | $3\times10^{16}$ cm$^{-3}$ | 41 Å |
| n | AlInAs | $3\times10^{16}$ cm$^{-3}$ | 23 Å |
| n | GaInAs | $3\times10^{16}$ cm$^{-3}$ | 46 Å |
| n | AlInAs | $3\times10^{16}$ cm$^{-3}$ | 18 Å |
| n | GaInAs | $3\times10^{16}$ cm$^{-3}$ | 52 Å |
| n | AlInAs | $3\times10^{16}$ cm$^{-3}$ | 12 Å |
| n | GaInAs | $3\times10^{16}$ cm$^{-3}$ | 58 Å |
| n | AlInAs (bottom) | $3\times10^{16}$ cm$^{-3}$ | 6 Å |

FIG. 3J

| DOPANT TYPE | SEMICONDUCTOR TYPE | Si DOPANT CONCENTRATION | THICKNESS |
|---|---|---|---|
| i | AlInAs (top) | | 5 Å |
| i | GaInAs | | 36 Å |
| i | AlInAs | | 8 Å |
| n | GaInAs | $1 \times 10^{17}$ cm$^{-3}$ | 33 Å |
| n | AlInAs | $1 \times 10^{17}$ cm$^{-3}$ | 12 Å |
| n | GaInAs | $1 \times 10^{17}$ cm$^{-3}$ | 29 Å |
| i | AlInAs (bottom) | | 16 Å |

FIG. 3K

| DOPANT TYPE | SEMICONDUCTOR TYPE | Si DOPANT CONCENTRATION | THICKNESS |
|---|---|---|---|
| i | GaInAs (top) | | 35 Å |
| i | AlInAs | | 20 Å |
| i | GaInAs | | 29 Å |
| n | AlInAs | $3 \times 10^{17}$ cm$^{-3}$ | 18 Å |
| n | GaInAs | $3 \times 10^{17}$ cm$^{-3}$ | 30 Å |
| n | AlInAs | $3 \times 10^{17}$ cm$^{-3}$ | 18 Å |
| i | GaInAs | | 32 Å |
| i | AlInAs | | 23 Å |
| i | GaInAs | | 31 Å |
| i | AlInAs | | 45 Å |
| i | GaInAs | | 15 Å |
| i | AlInAs | | 15 Å |
| i | GaInAs | | 67 Å |
| i | AlInAs | | 14 Å |
| i | GaInAs | | 53 Å |
| i | AlInAs (bottom) | | 26 Å |

FIG. 3 L

| DOPANT TYPE | SEMICONDUCTOR TYPE | Si DOPANT CONCENTRATION | THICKNESS |
|---|---|---|---|
| i | GaInAs (top) | 0 | 35 Å |
| i | AlInAs | 0 | 20 Å |
| n | GaInAs | $1 \times 10^{17}$ cm$^{-3}$ | 29 Å |
| n | AlInAs | $1 \times 10^{17}$ cm$^{-3}$ | 18 Å |
| n | GaInAs | $1 \times 10^{17}$ cm$^{-3}$ | 30 Å |
| i | AlInAs (bottom) | | 18 Å |

FIG. 3 M

| DOPANT TYPE | SEMICONDUCTOR TYPE | Si DOPANT CONCENTRATION | THICKNESS |
|---|---|---|---|
| n | AlInAs (top) | $5 \times 10^{16}$ cm$^{-3}$ | 5 Å |
| n | GaInAs | $5 \times 10^{16}$ cm$^{-3}$ | 45 Å |
| n | AlInAs | $5 \times 10^{16}$ cm$^{-3}$ | 10 Å |
| n | GaInAs | $5 \times 10^{16}$ cm$^{-3}$ | 40 Å |
| n | AlInAs | $5 \times 10^{16}$ cm$^{-3}$ | 15 Å |
| n | GaInAs | $5 \times 10^{16}$ cm$^{-3}$ | 35 Å |
| n | AlInAs | $5 \times 10^{16}$ cm$^{-3}$ | 20 Å |
| n | GaInAs | $5 \times 10^{16}$ cm$^{-3}$ | 30 Å |
| n | AlInAs | $5 \times 10^{16}$ cm$^{-3}$ | 25 Å |
| n | GaInAs (bottom) | $5 \times 10^{16}$ cm$^{-3}$ | 25 Å |

FIG. 3N

| Layer ID | Semiconductor Type | REAL PART OF R.I. AT 7.1μm/9.5μm | IMAGINARY PART OF R.I. (units=×10⁻⁴) AT 7.1μm/9.5μm | REAL PART OF R.I. AT 3.5μm/ 4.1μm/4.75μm | IMAGINARY PART OF R.I. (units=×10⁻⁴) AT 3.5μm/4.1μm/4.75μm |
|---|---|---|---|---|---|
| A | GaInAs (top) | | | | |
| B | GaInAs | 2.41 / 0.941 | 496 /3040 | 3.26 / 3.17 / 3.05 | 43.9 / 72.6 / 117 |
| C | Ga$_{0.5x}$Al$_{0.5(1-x)}$InAs (graded) | | | | |
| D | AlInAs | 3.179 / 3.165 | 7.035 / 16.93 | 3.193 / 3.192 / 3.189 | 0.839 / 1.349 / 2.1 |
| E | AlInAs | 3.189 / 3.181 | 3.507 / 8.421 | 3.196 / 3.195 / 3.194 | 0.419 / 0.674 / 1.05 |
| F | Ga$_{0.5x}$Al$_{0.5(1-x)}$InAs (graded) | | | | |
| G | GaInAs | 3.477 / 3.471 | 2.862 / 6.868 | 3.483 / 3.482 / 3.482 | 0.342 / 0.55 / 0.856 |
| H | top injector | | | | |
| I | 19 active regions and injectors | 3.37 / 3.367 | 1.73 / 3.267 | 3.373 / 3.373 / 3.374 | 0.517 / 0.333 / 0.207 |
| J | bottom injector | | | | |
| K | GaInAs | | | | |
| L | Ga$_{0.5x}$Al$_{0.5(1-x)}$InAs (graded) | | | | |
| M | 9 intermediate superlattice layers | 3.371 / 3.368 | 1.363 / 3.267 | 3.374 / 3.374 / 3.373 | 0.163 / 0.262 / 0.408 |
| N | Ga$_{0.5x}$Al$_{0.5(1-x)}$InAs (graded) | | | | |
| O | GaInAs | | | | |
| P | top injector | | | | |
| Q | 16 active regions and injectors | 3.406 / 3.401 | 2.047 / 4.91 | 3.409 / 3.409 / 3.409 | 0.245 / 0.394 / 0.612 |
| R | bottom injector | | | | |
| S | GaInAs | 3.477 / 3.471 | 2.862 / 6.868 | 3.483 / 3.482 / 3.482 | 0.342 / 0.55 / 0.856 |
| T | Ga$_{0.5x}$Al$_{0.5(1-x)}$InAs (graded) | | | | |
| U | InP substrate (bottom) | 3.082 / 3.067 | 6.895 / 16.59 | 3.096 / 3.094 / 3.092 | 0.822 / 1.322 /2.058 |

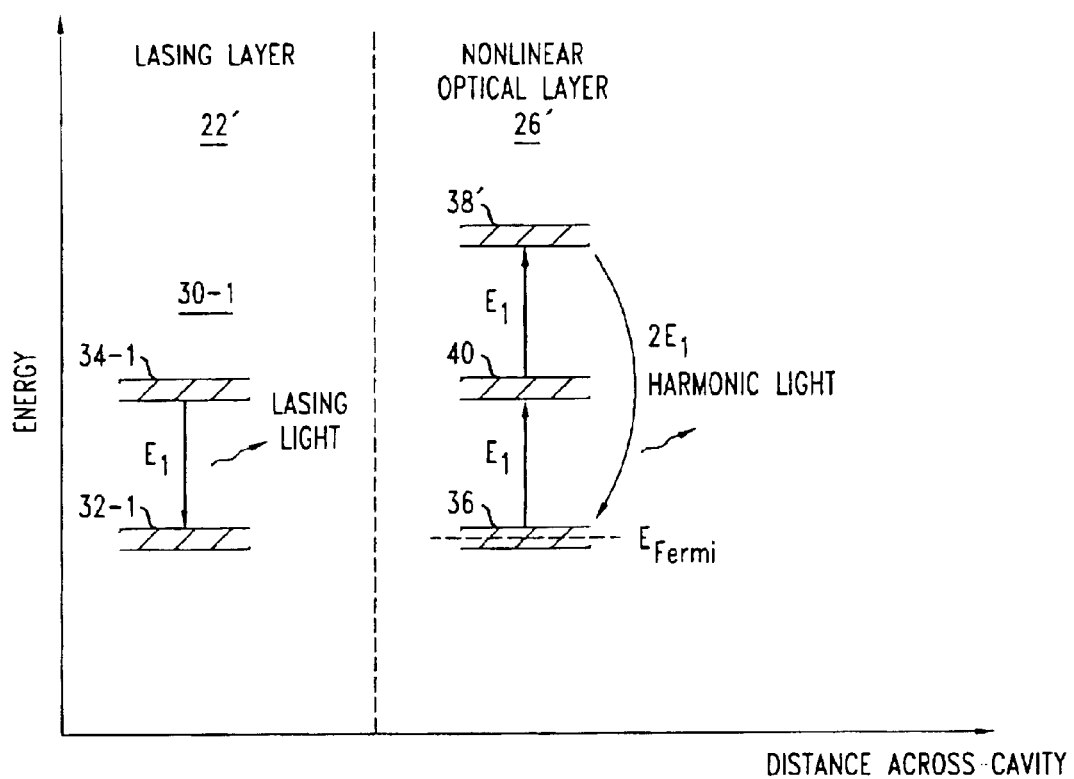

FIG. 10A

| LAYER ID | DOPANT TYPE | SEMICONDUCTOR TYPE | Si DOPANT CONCENTRATION | THICKNESS |
|---|---|---|---|---|
| AA | n++ | GaInAs | $1 \times 10^{20}$ cm$^{-3}$ | 100 Å |
| BB | n | GaInAs | $8 \times 10^{18}$ cm$^{-3}$ | 3500 Å |
| CC | n | $Ga_{0.5 x} Al_{0.5(1-x)}$ InAs (graded) | $1 \times 10^{17}$ cm$^{-3}$ | 250 Å |
| DD | n | AlInAs | $1 \times 10^{17}$ cm$^{-3}$ | 18000 Å |
| EE | n | $Ga_{0.5 x} Al_{0.5(1-x)}$ InAs (graded) | $1 \times 10^{17}$ cm$^{-3}$ | 250 Å |
| FF | n | GaInAs | $5 \times 10^{16}$ cm$^{-3}$ | 11000 Å |
| GG | n | $Ga_{0.5 x} Al_{0.5(1-x)}$ InAs (graded) | $1 \times 10^{17}$ cm$^{-3}$ | 250 Å |
| HH | n | AlInAs | $1 \times 10^{17}$ cm$^{-3}$ | 8000 Å |
| II | n | $Ga_{0.5 x} Al_{0.5(1-x)}$ InAs (graded) | $1 \times 10^{17}$ cm$^{-3}$ | 250 Å |
| JJ | n | 31x $Ga_{0.5 x} Al_{0.5(1-x)}$ InAs active units | | 482 Å |
| KK | n | $Ga_{0.5 x} Al_{0.5(1-x)}$ InAs (graded) | $1 \times 10^{17}$ cm$^{-3}$ | 250 Å |
| LL | n | AlInAs | $1 \times 10^{17}$ cm$^{-3}$ | 8000 Å |
| MM | n | $Ga_{0.5 x} Al_{0.5(1-x)}$ InAs (graded) | $1 \times 10^{17}$ cm$^{-3}$ | 250 Å |
| NN | n | GaInAs | $5 \times 10^{16}$ cm$^{-3}$ | 11000 Å |
| OO | n | $Ga_{0.5 x} Al_{0.5(1-x)}$ InAs (graded) | $1 \times 10^{17}$ cm$^{-3}$ | 250 Å |
| QQ | n | InP | $1-4 \times 10^{17}$ cm$^{-3}$ | FULL WAFER |

FIG. 10B

| DOPANT TYPE | SEMICONDUCTOR TYPE | Si DOPANT CONCENTRATION | THICKNESS |
|---|---|---|---|
| i | GaInAs (top) | | 36 Å |
| i | AlInAs | | 22 Å |
| i | GaInAs | $4.5 \times 10^{17}$ cm$^{-3}$ | 34 Å |
| i | AlInAs | $4.5 \times 10^{17}$ cm$^{-3}$ | 21 Å |
| i | GaInAs | $4.5 \times 10^{17}$ cm$^{-3}$ | 33 Å |
| i | AlInAs | $4.5 \times 10^{17}$ cm$^{-3}$ | 21 Å |
| i | GaInAs | | 33 Å |
| i | AlInAs | | 25 Å |
| i | GaInAs | | 32 Å |
| i | AlInAs | | 43 Å |
| i | GaInAs | | 14 Å |
| i | AlInAs | | 13 Å |
| i | GaInAs | | 68 Å |
| i | AlInAs | | 11 Å |
| i | GaInAs | | 51 Å |
| i | AlInAs (bottom) | | 26 Å |

FIG. 10C

| DOPANT TYPE | SEMICONDUCTOR TYPE | Si DOPANT CONCENTRATION | THICKNESS |
|---|---|---|---|
| n | AlInAs (top) | $1 \times 10^{17}$ cm$^{-3}$ | 8 Å |
| n | GaInAs | $1 \times 10^{17}$ cm$^{-3}$ | 42 Å |
| n | AlInAs | $1 \times 10^{17}$ cm$^{-3}$ | 16 Å |
| n | GaInAs | $1 \times 10^{17}$ cm$^{-3}$ | 34 Å |
| n | AlInAs | $1 \times 10^{17}$ cm$^{-3}$ | 25 Å |
| n | GaInAs | $1 \times 10^{17}$ cm$^{-3}$ | 25 Å |
| n | AlInAs | $1 \times 10^{17}$ cm$^{-3}$ | 34 Å |
| n | GaInAs | $1 \times 10^{17}$ cm$^{-3}$ | 16 Å |
| n | AlInAs | $1 \times 10^{17}$ cm$^{-3}$ | 42 Å |
| n | GaInAs (bottom) | $1 \times 10^{17}$ cm$^{-3}$ | 8 Å |

FIG. 10D

| DOPANT TYPE | SEMICONDUCTOR TYPE | Si DOPANT CONCENTRATION | THICKNESS |
|---|---|---|---|
| n | GaInAs (top) | $1 \times 10^{17}$ cm$^{-3}$ | 8 Å |
| n | AlInAs | $1 \times 10^{17}$ cm$^{-3}$ | 42 Å |
| n | GaInAs | $1 \times 10^{17}$ cm$^{-3}$ | 16 Å |
| n | AlInAs | $1 \times 10^{17}$ cm$^{-3}$ | 34 Å |
| n | GaInAs | $1 \times 10^{17}$ cm$^{-3}$ | 25 Å |
| n | AlInAs | $1 \times 10^{17}$ cm$^{-3}$ | 25 Å |
| n | GaInAs | $1 \times 10^{17}$ cm$^{-3}$ | 34 Å |
| n | AlInAs | $1 \times 10^{17}$ cm$^{-3}$ | 16 Å |
| n | GaInAs | $1 \times 10^{17}$ cm$^{-3}$ | 42 Å |
| n | AlInAs (bottom) | $1 \times 10^{17}$ cm$^{-3}$ | 8 Å |

FIG. 10 E

| DOPANT TYPE | SEMICONDUCTOR TYPE | Si DOPANT CONCENTRATION | THICKNESS |
|---|---|---|---|
| n | AlInAs (top) | $1\times10^{17}$ cm$^{-3}$ | 5 Å |
| n | GaInAs | $1\times10^{17}$ cm$^{-3}$ | 45 Å |
| n | AlInAs | $1\times10^{17}$ cm$^{-3}$ | 10 Å |
| n | GaInAs | $1\times10^{17}$ cm$^{-3}$ | 40 Å |
| n | AlInAs | $1\times10^{17}$ cm$^{-3}$ | 15 Å |
| n | GaInAs | $1\times10^{17}$ cm$^{-3}$ | 35 Å |
| n | AlInAs | $1\times10^{17}$ cm$^{-3}$ | 20 Å |
| n | GaInAs | $1\times10^{17}$ cm$^{-3}$ | 30 Å |
| n | AlInAs | $1\times10^{17}$ cm$^{-3}$ | 25 Å |
| n | GaInAs (bottom) | $1\times10^{17}$ cm$^{-3}$ | 25 Å |

NONLINEAR SEMICONDUCTOR LIGHT SOURCES

The U.S. Government has a paid-up license in this invention and the right in limited circumstances to require the patent owner to license others on reasonable terms as provided for by the terms of contract No. DAAD19-00-C-0096 awarded by DARPA and the U.S. Army Research Office.

BACKGROUND

1. Field of the Invention

The invention relates to semiconductor light sources and semiconductor lasers.

2. Discussion of the Related Art

Materials with large second-order and/or third-order nonlinear susceptibilities can produce direct optical frequency-conversion. In direct optical frequency-conversion, incident light generates new light with a frequency that is the sum, difference, or a harmonic of the frequency or frequencies of the incident light. Thus, incident light at frequencies $\omega_1$ and $\omega_2$ produces light at one or more of the frequencies $\omega_1+\omega_2$, $\omega_1-\omega_2$, $2\omega_1$, $2\omega_2$, $3\omega_1$, $3\omega_2$, etc. Herein, the light produced by nonlinear processes at sums and differences of incident frequencies will be referred to as parametric light, and the light produced by nonlinear processes at doubles, triples, etc. of an incident frequency will be referred to as harmonic light.

Nonlinear optical materials have provided conventional sources for parametric and harmonic light. These conventional sources typically include one or more normal light sources, e.g., standard laser(s), and a non-linear crystal or a nonlinear optical fiber. The nonlinear crystal or nonlinear optical fiber generates parametric and/or harmonic light in response to receiving high intensity incident light from the normal light source(s). Such conventional sources for parametric and/or harmonic light are complex and need substantial optics for coupling the normal light source(s) to the nonlinear crystal or nonlinear optical fiber.

It would be advantageous to have a monolithic source for parametric and/or harmonic light, because such a source would require less optics for coupling the normal light source or sources to the nonlinear optical material.

Inter-intersubband transitions in multiple quantum well structures have produced optical frequency-conversion by nonlinear processes, but not in monolithic structures. Instead, the frequency conversion was produced by externally illuminating quantum well structures with intense light produced by physically separate mid-infrared lasers. Such coupling configurations are not geometrically optimal due to the in-plane nature of such inter-subband transitions.

SUMMARY

The various embodiments provide monolithic semiconductor sources for parametric and/or harmonic light. In monolithic sources, lasing materials couple directly to the nonlinear medium for frequency-conversion without intervening optical couplers.

In one aspect, the invention features a monolithic apparatus having a laser cavity. The laser optical cavity has a multi-layer structure that includes a first active semiconductor multi-layer and a second semiconductor multi-layer. The second semiconductor multi-layer is located laterally adjacent to the first active semiconductor multi-layer. The first active semiconductor multi-layer includes a sequence of quantum well structures that produce light of a lasing frequency in response to being electrically pumped. The second semiconductor multi-layer includes a sequence of quantum well structures and is configured to both absorb light of the lasing frequency and produce one of parametric light and harmonic light in response to absorbing the light of the lasing frequency.

In another aspect, the invention features a monolithic apparatus that includes a laser optical cavity. The laser optical cavity has an active semiconductor multi-layer with a sequence of quantum well structures. The sequence of quantum well structures produces light of a lasing frequency in response to being electrically pumped. The sequence of quantum well structures is configured to absorb light at a harmonic of the lasing frequency and to produce light at the harmonic of the lasing frequency in response to the cavity lasing at the lasing frequency.

BRIEF DESCRIPTION OF THE FIGURES

FIG. 3A shows the layer sequence in a GaInAs and GaAlInAs embodiment of the monolithic optical source of FIG. 1;

FIG. 3B shows the detailed layer sequence for a graded top cladding sublayer C of the monolithic optical source of FIG. 3A;

FIG. 3C shows the detailed layer sequence for a graded top cladding sublayer F of the monolithic optical source of FIG. 3A;

FIG. 3D shows the detailed layer sequence for a top injector layer H of the top lasing layer in the monolithic optical source of FIG. 3A;

FIG. 3E shows the detailed layer sequence for the 19 intermediate active and injector regions I in the top lasing layer of the monolithic optical source of FIG. 3A;

FIG. 3F shows the detailed layer sequence for the bottom injector layer J of the top lasing layer in the monolithic optical source of FIG. 3A;

FIG. 3G shows the detailed layer sequence for a graded top GaAlInAs layer L of the intermediate nonlinear optical layer in the monolithic optical source of FIG. 3A;

FIG. 3H shows the detailed layer sequence for the 9 intermediate superlattice layers M of the intermediate nonlinear optical layer in the monolithic optical source of FIG. 3A;

FIG. 3I shows the detailed layer sequence for the bottom graded GaAlInAs layer N of the intermediate nonlinear optical layer in the monolithic optical source of FIG. 3A;

FIG. 3J shows the detailed layer sequence for the top injector layer P of the bottom lasing layer in the monolithic optical source of FIG. 3A;

FIG. 3K shows the detailed layer sequence for the 16 intermediate active and injector regions Q of the bottom lasing layer in the monolithic optical source of FIG. 3A;

FIG. 3L shows the detailed layer sequence for the bottom injector layer R of the bottom lasing layer in the monolithic optical source of FIG. 3A;

FIG. 3M shows the detailed layer sequence for the graded GaAlInAs cladding layer T located adjacent to the InP substrate in the monolithic optical source of FIG. 3A;

FIG. 3N shows real parts and imaginary parts (units= times $10^{-4}$) of refractive indexes (R.I.) for the semiconductor layers of the monolithic optical source of FIG. 3A at lasing wavelengths 7.1 μm and 9.5 μm; $1^{st}$-harmonic wavelengths 3.5 μm and 4.75 μm; and parametric wavelength 4.1 μm;

FIGS. 6A and 6B schematically illustrate the miniband structure in the optical core layers of the monolithic optical sources of FIGS. 5A and 5B, respectively;

FIG. 10A shows the semiconductor layer sequence for an exemplary monolithic optical source of phase matched $1^{st}$-harmonic light of the type shown in FIG. 9;

FIG. 10B shows the detailed layer sequence for the 31 active units JJ of the monolithic optical source of FIG. 10A;

FIG. 10C shows the detailed layer sequence for graded cladding sublayers CC, GG, KK of the monolithic optical source of FIG. 10A;

FIG. 10D shows the detailed layer sequence for graded cladding sublayers EE, II, MM of the monolithic optical source of FIG. 10A;

FIG. 10E shows the detailed layer sequence for graded cladding sublayer OO of the monolithic optical source of FIG. 10A.

DETAILED DESCRIPTION OF ILLUSTRATIVE EMBODIMENTS

1. Monolithic Nonlinear Optical Sources of Parametric and Harmonic Light

Figure 1:
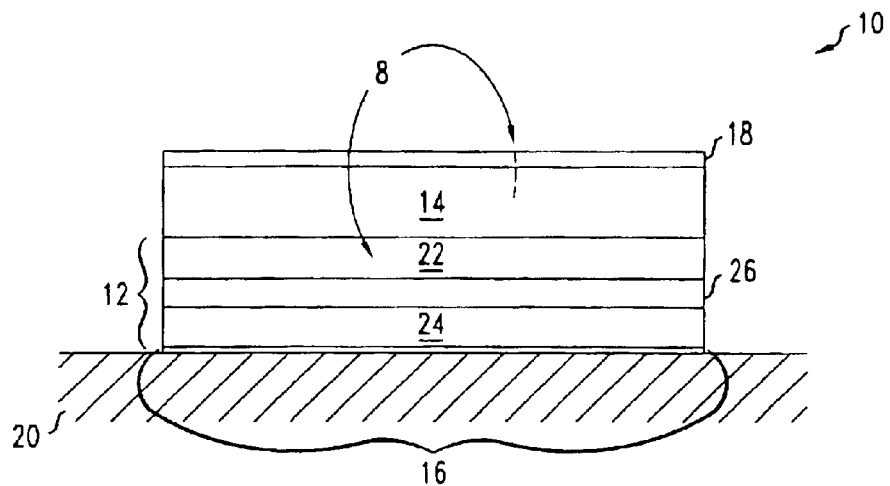
FIG. 1 is a frontal cross-sectional view of an embodiment for a monolithic optical source of parametric light.

FIG. 1 shows an end view of one embodiment of a parametric light source 10. The parametric light source 10 has an optical laser cavity. The laser cavity includes an optical waveguide with an optical core layer 12 and top and bottom optical cladding layers 14, 16 and reflective and partially reflective end facets 8 at the ends of the cavity. The optical core layer 12 functions as an active layer for producing both stimulated emission light and parametric light. The stimulated emission light results from pumping the optical core layer 12 with a current via metallic electrode 18 and a conductive substrate 20. The stimulated emission or laser light produces parametric light via two-photon processes in the nonlinear optical medium of the optical core layer 12.

In the optical core layer 12, top and bottom lasing layers 22, 24 are the sources of the laser light and an intermediate nonlinear optical layer 26 includes the nonlinear optical medium in which the parametric light is produced. The lasing layers 22, 24 are preferably semiconductor multilayer structures equivalent to an active core layer of a quantum cascade laser. The lasing results from current pumping the top and bottom lasing layers 22, 24.

The physical arrangement of the layers 12, 14, 16 22, 24, 26 provides both pumping and illumination functions. With respect to pumping, the intermediate nonlinear optical layer 26 forms a current path with a resistance that is low enough to allow adequate current to pass through for pumping the top and bottom lasing layers 22, 24. With respect to illumination, the optical core and cladding layers 12, 14, 16 are configured to produce two fundamental spatial lasing modes that strongly spatially overlap in the intermediate nonlinear optical layer 26. The strong spatial overlap increases rates for the two-photon processes that produce parametric light. Preferably, the two fundamental spatial lasing modes have intensity peaks that are physically aligned with and extend through the intermediate nonlinear optical layer 26.

The monolithic parametric light source 10 directly optically couples the lasing layers 22, 24 to the intermediate nonlinear optical layer 26 without any optics except the optical elements needed to form the laser cavity itself.

Both the lasing and intermediate layers 22, 24, 26 are 2-dimensional semiconductor multi-layers that contain cascaded sequences of quantum well structures. The structures of the lasing layers 22, 24 are similar to those of typical quantum cascade lasers. These semiconductor structures form a sequence of alternating active and injector regions.

Figure 2:
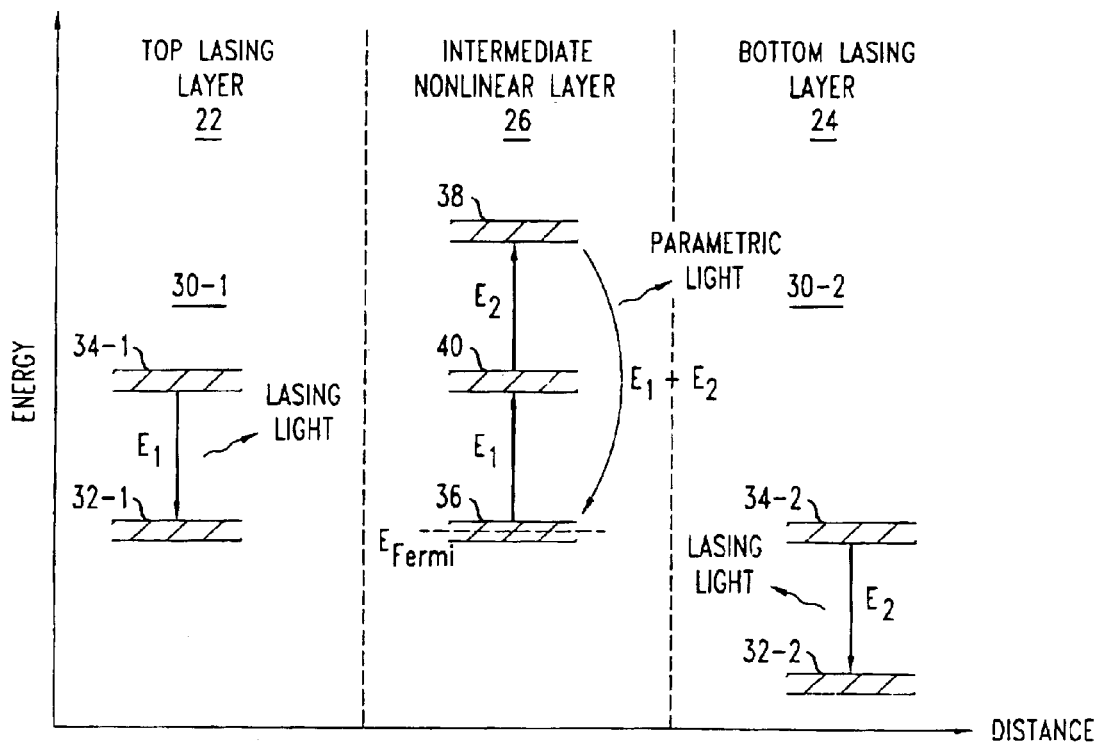
FIG. 2 schematically illustrates the miniband structure in the optical core layer of the monolithic optical source of FIG. 1.

FIG. 2 schematically illustrates the miniband structures in the lasing and intermediate nonlinear optical layers 22, 24, 26 in a manner that describes the charge carrier transitions involved in optical processes. In the exemplary active regions 30-1, 30-2 of the top and bottom lasing layers 22, 24, coupled quantum wells produce lower minibands 32-1, 32-2 and upper minibands 34-1, 34-2. Charge carrier transitions between these minibands, i.e., transitions 34-1→32-1 and 34-2→34-1, produce the stimulated emission light that causes lasing. In the injector regions of the lasing layers 22, 24, coupled quantum wells form a transport miniband (not shown). The transport miniband aligns with minibands of adjacent active regions to enable transport of current carriers between these active regions during current pumping.

Herein, miniband and subband can be used interchangeably.

The intermediate nonlinear optical layer 26 is a semiconductor superlattice structure that forms of a sequence of coupled asymmetric double quantum well structures. Generally, the coupled quantum well structures produce a miniband structure that generates the layer's nonlinear optical behavior and the layer's current transport properties.

In particular, the miniband structure of the intermediate nonlinear optical layer 26 includes a lowest miniband 36 and one or more higher energy minibands 38, 40. The lowest miniband 36 is partially filled during pumping as shown by the position of the Fermi energy ($E_{Fermi}$). Thus, the miniband 36 provides a low resistance pathway for pumping current that is traveling between the top lasing layer 22 and the bottom lasing layer 24.

Also, the miniband structure provides for resonant optical absorption of photons at about the sum of the energies $E_1$ and $E_2$ of laser photons produced by the lasing layers 22 and 24. Due to the miniband structure, optical absorption measurements on the intermediate nonlinear optical layer 26 would show a resonant optical absorption peak at peak frequency that is the sum of the cavity's two lasing frequencies.

In the intermediate nonlinear optical layer 26, the resonant optical absorption peak exists, because the higher miniband 38 and lowest miniband 36 have lower miniband edges that are shifted by $E_1+E_2\pm\Delta$ with $E_1$, $E_2 > \Delta$. Here, $\Delta$ is the effective spectral width of the optical transition between minibands 38 and 36 when measured, e.g., in plain absorption or spontaneous emission. Such a designed matching of bandgaps to sums of photon energies increases the probability of two lasing photon absorptions in the intermediate nonlinear layer 26. In turn, this increases the rate for producing parametric light with a frequency that is equal to the sum of the frequencies of the laser light produced in the lasing layers 22, 24.

Preferably, the miniband structure of the intermediate nonlinear optical layer 26 also includes an intermediate energy miniband 40. The miniband 40 has a lower miniband edge that is shifted by about either $E_1$ or $E_2$ with respect to the lower miniband edge of the lowest miniband 36 of the intermediate nonlinear optical layer 26, i.e. the shift is equal to $E_1$ or $E_2$ with an error of about $\Delta$ or less.

The presence of such a triplet of minibands 36, 40, 38, which are directly involved in the carrier transitions that pump and produce parametric light, will also significantly increase the rate for the optical absorption processes that produce parametric light from the laser light frequencies generated by the lasing layers 22, 24. This triplet miniband structure will cause the intermediate nonlinear optical layer 26 to have a resonant optical absorption peak at both the sum of the two lasing frequencies and at one of the two lasing frequencies.

Preferably, the minibands 36, 38, and 40 are also narrow minibands or isolated subbands, i.e., $E_1$, $E_2 \gg \Delta$. Such narrow minibands also increase the rate for producing parametric light.

Finally, the physical asymmetry of the coupling of quantum well structures in the intermediate nonlinear optical layer 26 produces local electrical dipole moments between all sub- and minibands. These electrical dipole moments produce the couplings to electric fields of the laser light. Preferably, dipole moments between the triplet minibands' states are large, because large dipoles tend to couple to the laser light more strongly and thus, increase the rate for producing parametric light via non-linear optical processes in the nonlinear optical layer 26.

Conventional molecular beam epitaxy (MBE) techniques have enabled the fabrication of an exemplary mesa semiconductor structure for the light source 10 of FIG. 1. In particular, the exemplary mesa structure has the miniband structure of FIG. 2. The exemplary semiconductor structure includes the top and bottom cladding layers 14, 16, and the optical core 12 and is based on $In_{0.53}Ga_{0.47}As/Al_{0.48}In_{0.52}As$ heterostructures. The indium gallium arsenide (InGaAs) and aluminum indium arsenide (AlInAs) multi-layered structures were grown on a low n-type doped (100) InP substrate. A typical fabricated mesa semiconductor structure has a length of 1.57 mm, a width of 10 $\mu$m, and height of 7.2 $\mu$m.

FIGS. 3A–3M provide a detailed description of the sequence of semiconductor layers in this exemplary InGaAs/AlInAs mesa structure for the light source 10. For each layer, FIGS. 3A–3M provide: dopant types (i.e., n-type (n), p-type (p), or intrinsic (i)), semiconductor alloy type, silicon (Si) dopant concentration, and approximate layer thicknesses (e.g., ±10%).

Referring to FIGS. 3A, 3B–3C, and 3M, the top cladding 14 and bottom cladding 16 of the exemplary mesa structure include the respective layer sequences A–G and S–U. The bottom cladding 16 includes the InP substrate U and a 5,000 Å thick GaInAs buffer layer S that is n-type doped with about $5\times10^{16}$ Si atoms per $cm^{-3}$. The top cladding 14 includes a 5,000 Å n-type GaInAs layer B that is doped with about $6\times10^{18}$ Si atoms per $cm^{-3}$; a 10,000 Å n-type AlInAs layer D that is doped with about $2\times10^{17}$ Si atoms per $cm^{-3}$; a 28,000 Å n-type AlInAs layer F that is doped with about $1\times10^{17}$ Si atoms per $cm^{-3}$, and a 2,000 Å n-type GaInAs layer G that is doped with about $3\times10^{16}$ Si atoms per $cm^{-3}$.

Referring to FIGS. 3A, 3D–3F, and 3J–3L, the top and bottom lasing layers 22 and 24 of the exemplary mesa structure include respectively, a stack of 19 paired active and injector regions, shown in FIG. 3E, and a stack of 16 paired active and injector regions Q, shown in FIG. 3K. Another pair of injector regions (H,J) and (P, R) surrounds each stack of paired active and injector regions I, Q in the exemplary mesa structure. The active and injector regions of FIGS. 3E and 3K are themselves formed of coupled quantum well structures.

Referring to FIGS. 3A and 3G–3I, the intermediate nonlinear layer 22 includes 9 intermediate superlattice structures, shown in FIG. 3H, that use 41 angstrom (Å) wide InGaAs wells and 23 Å wide AlInAs barriers. The superlattice structure M and includes an additional nine 24 Å wide quantum well structures that are equally spaced in the nonlinear optical layer 22. This produces asymmetric pairs of coupled quantum well structures with electrical dipole moments. The superlattice also includes a Si dopant density of about $5\times10^{16}$ Si per $cm^{-3}$. This dopant level insures partial filling of superlattice's lowest miniband 36 during current pumping.

Figure 4A:
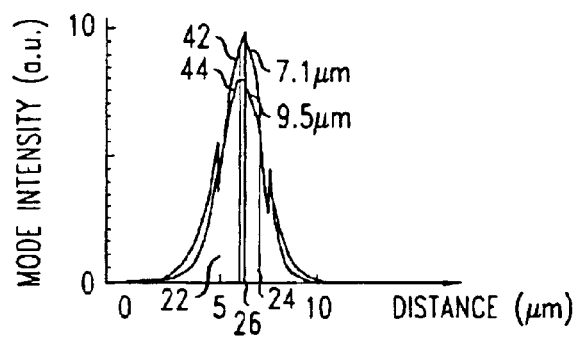
FIG. 4A shows the shapes and positions of the two fundamental 7.1 μm and 9.5 μm spatial lasing modes in the monolithic optical source of FIGS. 3A–3N.

FIG. 4A shows the shapes of the lasing modes 42, 44 produced by the exemplary mesa semiconductor structure of FIGS. 3A–3M. The two lasing modes 42 and 44 have respective peak wavelengths of 7.1 $\mu$m and 9.5 $\mu$m and are produced by the top and bottom lasing layers 22 and 24, respectively. The narrow laser cavity, i.e., less than 15 $\mu$m, and refractive index values shown in FIG. 3N cause the peaks of both lasing modes 42, 44 to be aligned over the intermediate nonlinear optical layer 26 thereby increasing the production rate for parametric light.

Figure 4B:
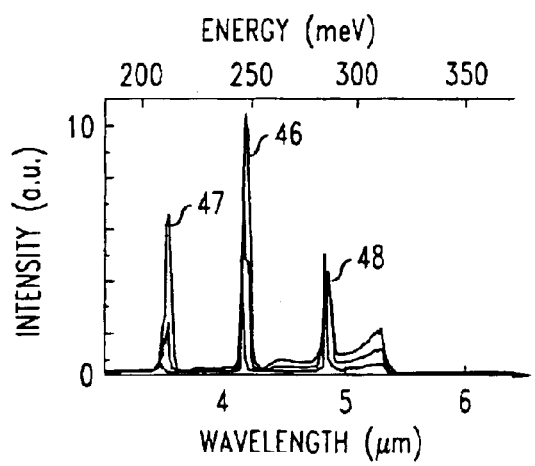
FIG. 4B shows output optical power spectra of nonlinear optically produced light for the monolithic optical source of FIGS. 3A–3N.

FIG. 4B shows the spectra of the light that nonlinear optical processes produce in the exemplary mesa semiconductor structure of FIGS. 3A–3M. The three overlapping spectra correspond to current densities of 6.3 kilo-amps per centimeter-squared ($kA/cm^2$), 9.5 $kA/cm^2$, and 12.7 $kA/cm^2$ and to an operating temperature of $-260°$ C. The exemplary mesa structure produces frequency-converted light with three spectral peaks 46–48, i.e., wavelengths of 4.1 $\mu$m, 3.5 $\mu$m, and 4.75 $\mu$m. These peaks 46–48 correspond to the sum of the frequencies associated with the 7.1 $\mu$m and 9.5 $\mu$m lasing modes, twice the frequency for the 7.1 $\mu$m lasing mode 42, and twice the frequency for the 9.5 $\mu$m lasing mode 44. Thus, the exemplary mesa structure produces parametric light and first-harmonic light for both fundamental lasing frequencies therein.

Figure 4C:
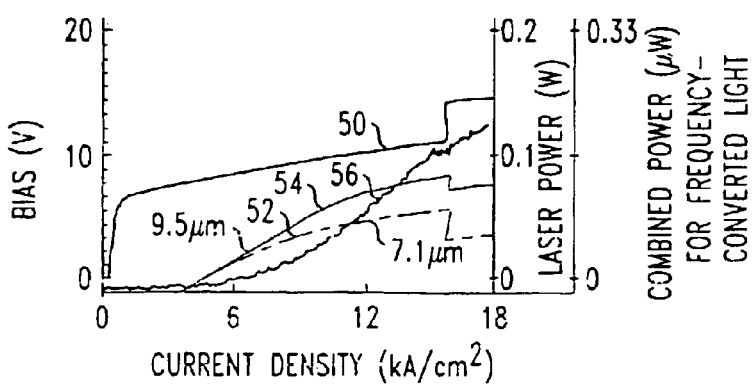
FIG. 4C shows total output optical powers for laser light and nonlinear optically produced light as a function of pumping current in the monolithic optical source of FIGS. 3A–3N.

FIG. 4C shows the voltage to pump-current characteristic 50 for the exemplary mesa structure of FIGS. 3A–3M and also shows the laser powers 52, 54 for the two lasing modes 42, 44 and the combined optical power 56 for the three produced types of frequency-converted light.

In light of the spectral peaks 46–48 of FIG. 4A, the exemplary mesa structure of FIGS. 3A–3M has been shown to produce parametric light and first-harmonic light for both lasing frequencies.

Figure 5A:
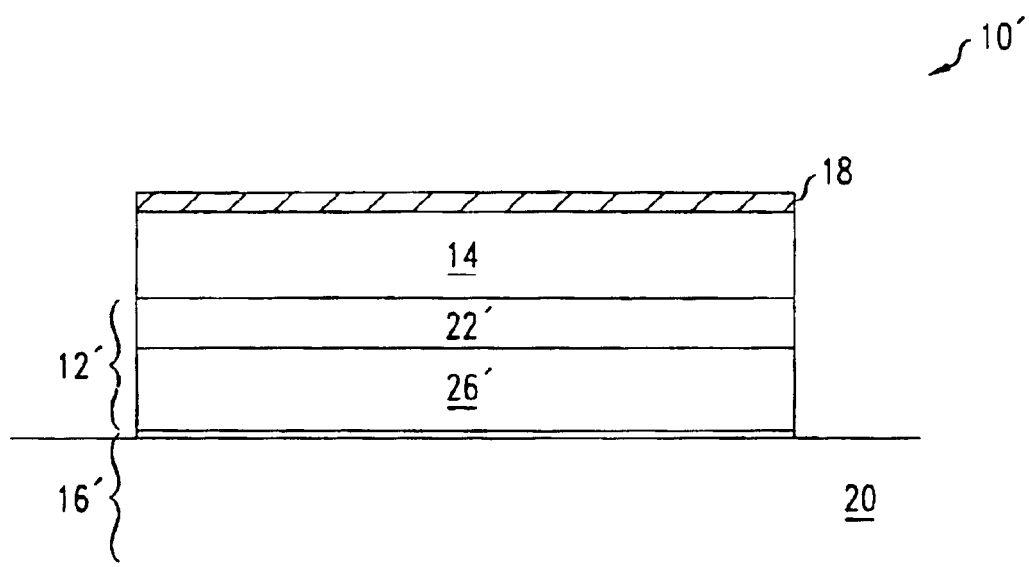
FIGS. 5A and 5B are end cross-sectional views of monolithic optical sources for harmonic light.
Figure 5B:
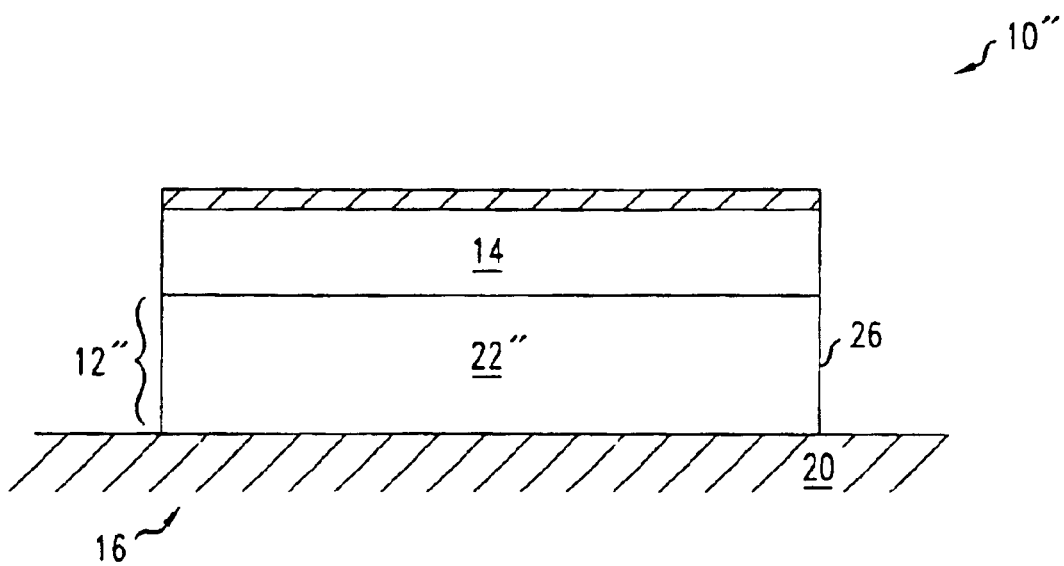
Figure 7:
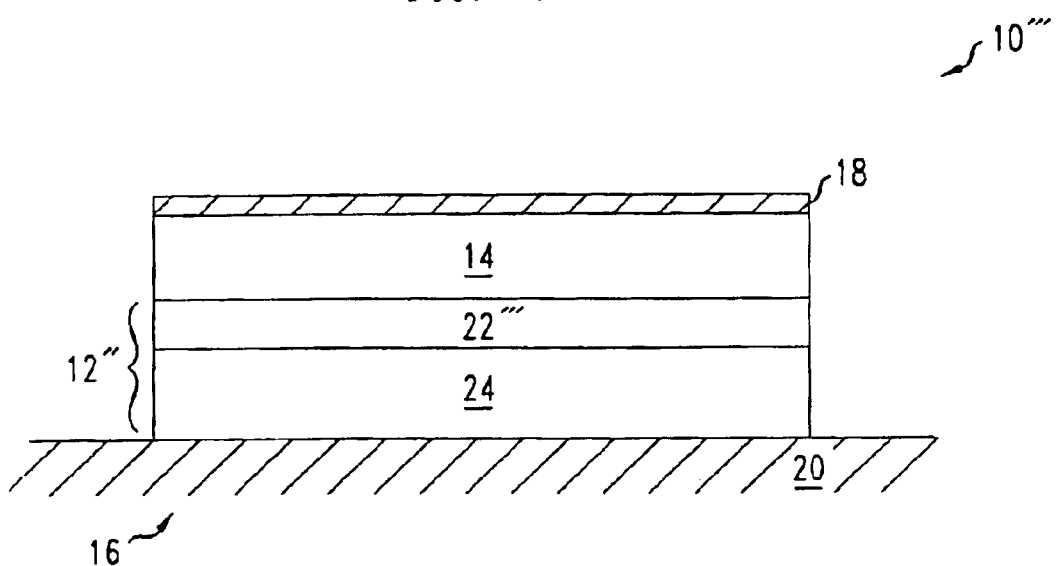
FIG. 7 is an end cross-sectional view of an alternate monolithic optical source for parametric light.

FIGS. 5A, 5B, and 7 show monolithic light sources 10', 10", 10''' that produce first-harmonic or higher-harmonic light via nonlinear optical processes.

FIG. 5A shows a light source 10' that includes a laser waveguide cavity with a semiconductor optical core layer 12' and semiconductor optical cladding layers 14, 16. The optical core layer includes both a lasing layer 22', which produces laser light in response to current pumping, and a nonlinear optical layer 26', which produces first-harmonic light from the laser light. The nonlinear optical layer 26' also provides a low resistance pathway to enable current pumping of the lasing layer 22' via conductive electrode 18 and conductive substrate 20. Both the lasing and nonlinear optical layers 22', 26' are 2-dimensional semiconductor structures that contain cascaded sequences of quantum well structures.

FIG. 6A schematically illustrates the miniband structures of the lasing layer 22' and nonlinear optical layer 26. These layers 22', 26' have physical structures that are similar to those of the lasing and nonlinear optical layers 22, 26 of FIG. 1. In particular, the lasing layer 22' has active regions 30-1 with the same minibands 32-1, 34-1 as active region 30-1 of the layer 22, shown in FIG. 2. Also, the nonlinear optical layer 26' has a miniband structure similar to that of nonlinear optical layer 26. The important difference in miniband structures is that higher miniband 38' of the layer 26' has a different energy than higher miniband 38 of the layer 26, shown in FIG. 2. In particular, the higher miniband 38' has an energy that provides for resonant optical absorption of two photons with a combined energy equal to twice $E_1$ where $E_1$ is the energy of photons produced by stimulated emission in lasing layer 22'. The shift between miniband edges of the highest miniband 38' and the lowest miniband 36 is equal to $2E_1 \pm \Delta$ where $E_1 > \Delta$. This shift insures that the nonlinear layer 26' will resonantly absorption photons have optical energies produced by stimulated emission in the lasing layer 22'. Thus, charge carrier transitions between minibands 38' and 36 will produce harmonic light with energy $2E_1$.

FIG. 5B shows a light source 10'' that is similar to the light source 10' except that a single semiconductor multilayer 22'' provides both lasing and nonlinear optical functionalities. The same layer 22'' produces both laser light and frequency-doubled laser light.

Figure 6B:
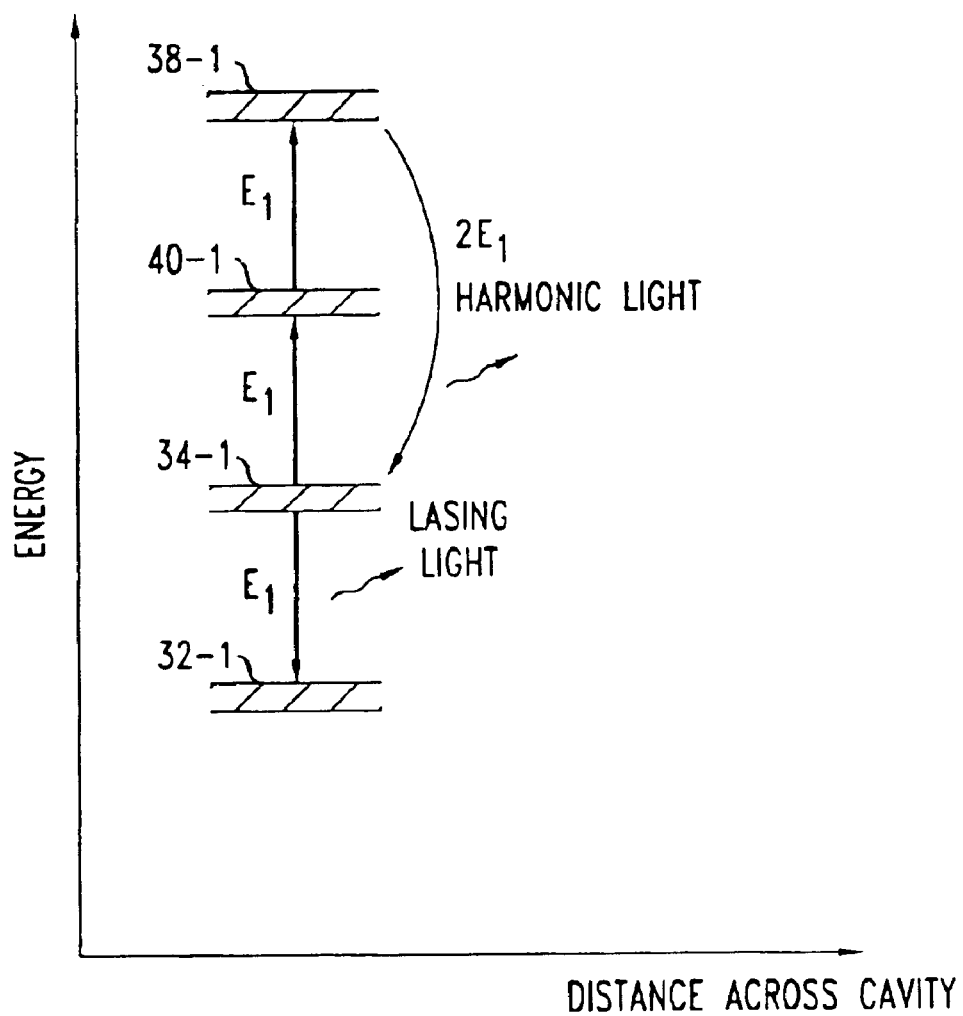

FIG. 6B illustrates optical properties of the miniband structure associated with the lasing layer 22''. The layer 22'' has a miniband structure similar to that of the lasing layer 22' of FIG. 5A except that the active regions of the layer 22'' have additional high energy miniband 38-1. The miniband 38-1 is shifted with respect to the pumped miniband 34-1 by the energy of two lasing photons, i.e., $2E_1$. That is the transition of a charge carrier from the miniband 34-1 to the miniband 38-1 requires an absorption of two lasing photons. The shift between the miniband edges of the higher miniband 38-1 and the middle miniband 34-1 is equal to $2E_1 \pm \Delta$. Here, $\Delta$ is the spectral width of the optical absorption line at the frequency of the first harmonic of the lasing frequency and $E_1 >> \Delta$. This miniband structure allows lasing photons to populate miniband 38-1 so that subsequent transitions to miniband 34-1 produce second harmonic light.

Preferably, the active regions of the lasing layer 22'' also include a triplet of minibands 38-1, 40-1, 34-1 that are directly involved in the nonlinear production of harmonic light. The energy of the miniband 40-1 provides for the resonant optical absorption of single photons at the lasing photon energy $E_1$, i.e., via carrier excitations from the pumped miniband 34-1. The shift between the lower miniband edges of the middle miniband 40-1 and the miniband 34-1 is equal to $E_1 \pm \Delta$. Again, $\Delta$ is the spectral width of the optical absorption line at the frequency of the first harmonic of the lasing frequency. The presence of the additional miniband 40-1 of the triplet and the absence of other minibands between the triplet minibands 38-1, 40-1, 34-1 increases rates for absorbing lasing photons and increases the rate for the production of first harmonic light via charge carrier transitions from the miniband 38-1 to the miniband 34-1.

FIG. 7 shows a parametric light source 10''' that is similar to the parametric light source 10 of FIG. 1 except that a single semiconductor multilayer 22''' provides both lasing and nonlinear optical functionalities.

Figure 8:
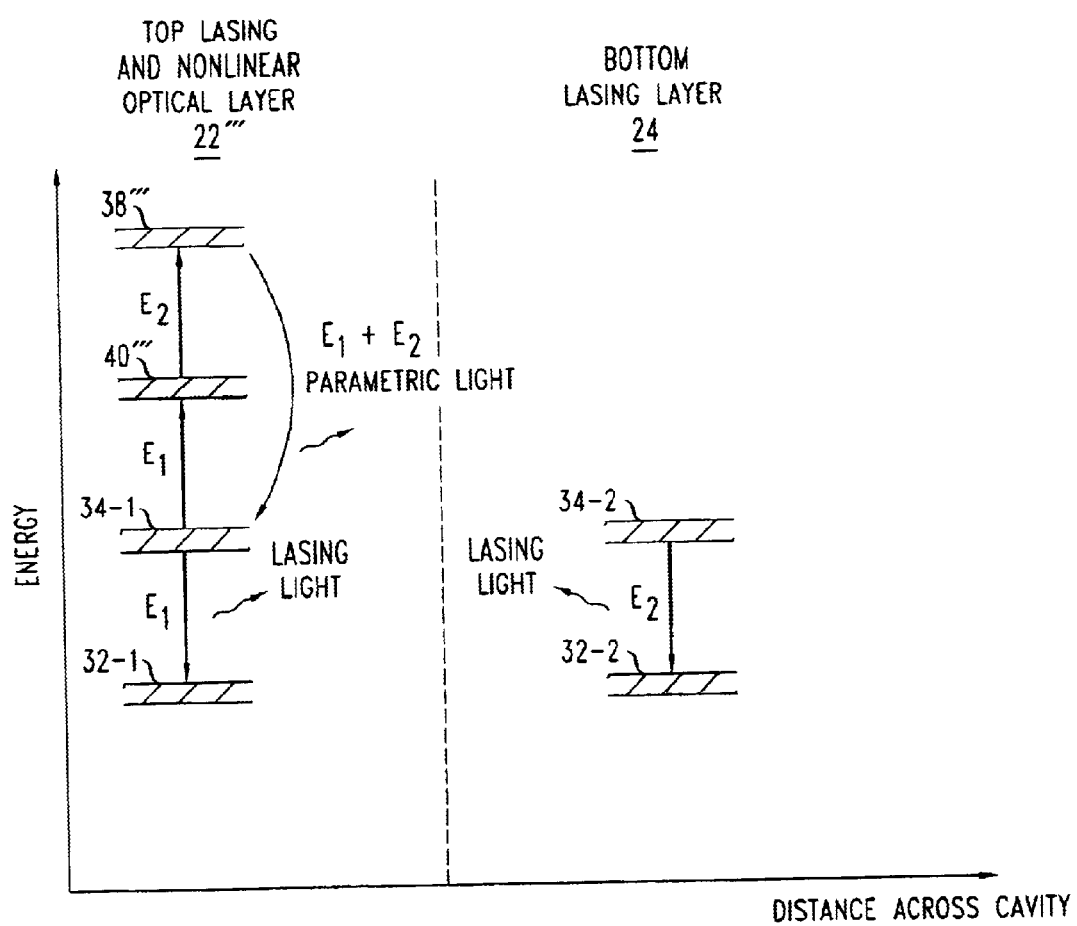
FIG. 8 schematically illustrates the miniband structure in the optical core layer of the monolithic optical source of FIG. 7.

Referring to FIG. 8, the lasing layer 22''' has a construction similar to that of the lasing layer 22 of FIGS. 1–2 except that active regions of the new layer 22''' have an additional higher miniband 8'''. The miniband 38''' as an energy shift that enables resonant optical absorption of photons with a total energy about equal to $E_1$ and $E_2$ via excitation of a carrier from the pumped miniband level 34-1. Here, $E_1$ and $E_2$ are the energies of lasing photons produced by the layers 22''' an 24, respectively. The shift between the lower miniband edges of the higher miniband 38''' and the pumped miniband 34-1 is approximately equal to $E_1 + E_2 \pm \Delta$. This shift allows a transition from the miniband 34-1 to the miniband 38''' to resonantly absorb photons with frequencies equal to the sum of the lasing frequencies and also allows a transition from miniband 38''' to miniband 34-1 to produce parametric light at the sum of the two lasing frequencies.

Preferably, the active regions of the lasing layer 22''' also include a triplet of minibands 38''', 40''', 34-1 directly involved in the nonlinear optical production of parametric light. In such a triplet, the miniband 40''' provides for the resonant optical absorption of single photons at one lasing photon energy, i.e., $E_1$, via a carrier excitation from the pumped miniband 34-1. The shift between the lower miniband edges of the middle miniband 40''' and the pumped miniband 34-1 is a out equal to $E_1$, i.e., the shift is $E_1 \pm \Delta$. Again, $\Delta$ is the spectral width of the absorption line associated with the absorption. Presence of the additional miniband increases the rate for absorbing lasing photons and thus, increases the rate for production of first harmonic light via transitions from the miniband 38'''. Preferably, no other minibands are intermediate to the minibands 38''', 40''', 34-1 of an active region so that the dipole transition elements that drive the nonlinear optical production of parametric light are large.

To provide higher optical powers, other embodiments for nonlinear light sources improve one or more relevant operating properties of the above light sources. Some such embodiments provide higher intensities of the laser light, which increases the production of parametric and/or harmonic light. To increase the laser light intensities, dopant levels are adjusted to produce larger carrier densities in those minibands responsible for the carrier transitions that produce laser light. Second, some such embodiments provide a nonlinear optical layer with a larger intrinsic polarization. The larger intrinsic polarizations increase the absorption of laser light in the nonlinear optical medium thereby increasing the production of parametric and/or harmonic light. Higher intrinsic polarizations result from larger local electrical dipole moments in the asymmetric superlattice structures of the nonlinear optical layer. Large dipole matrix elements may result if a triplet of minibands is involved in carrier transitions that pump and generate parametric or harmonic light, e.g., the miniband triplets (36, 40, 38), (36, 40, 38'), (34-1, 40-1, 38-1), (34-1, 40''', 38''') of FIGS. 2, 6A, 6B, and 8, provided that the triplet of minibands is not separated by intervening minibands in the same region. Finally, some such embodiments provide phase matching for the parametric and/or harmonic light produced at different axial positions in the laser cavity. The phase matching insures that parametric and/or harmonic light from different physical parts of the source's optical cavity interferes constructively rather than destructively thereby increasing total output intensity for such light.

2. Improved Monolithic Nonlinear Optical Sources with Phase Matching

In a nonlinear optical medium, dispersion causes light at a fundamental frequency and light at a harmonic of the fundamental to have different velocities. The velocity differences often lead to a relative phase difference between harmonic light that is nonlinearly produced at different axial beam locations in the medium. This relative phase difference can be described by a finite coherence length for the produced harmonic light.

If two-photon processes produce light at a $1^{st}$-harmonic of the lasing frequency by such nonlinear optical process, the $1^{st}$-harmonic will have a coherence length, $L_c$, that satisfies: $L_c \propto [(n(2w)-n(w))]^{-1}$. Here, "n(w)" and "n(2w)" are the refractive indexes at the respective fundamental frequency "w" and the $1^{st}$-harmonic frequency "2w". In a nonlinear optical medium, dispersing typically causes n(2w) and n(w) to be unequal. This implies that the coherence length of $1^{st}$-harmonic light will be finite so that the above-described relative phase mismatch will be present between harmonic light that is produce at different positions along a beam of laser light. If the phase mismatch is large enough, i.e., the coherence length is too short, the $1^{st}$-harmonic light from different positions along the laser beam will destructively interfere thereby reducing the overall intensity of light produced by nonlinear optical processes.

In a laser cavity, dispersion also usually produces a relative phase mismatch between harmonic or parametric light that is produced at different positions along the cavity's axis. Due to the phase mismatch the amplitudes of the harmonic or parametric light produced at different positions add with relative phases. This phased addition lowers the total intensity of light that is produced by nonlinear processes in the cavity. To increase the total intensity, the harmonic or parametric light should be produced without a relative phase mismatch in the laser cavity. Equivalently the coherence length for such light should be large compared to the cavity's length.

In optical laser cavities, different spatial cavity modes have different effective refractive indexes. The differences in effective refractive indexes result from the fact that the core and cladding regions of the cavity have different refractive indexes. Various spatial cavity modes penetrate into the cladding to differing amounts. For that reason, the different cavity modes have effective refractive indexes that depend differently on index variations between the core and cladding regions.

If laser light produces harmonic light in the same spatial cavity mode as the laser light, the harmonic light produced at different cavity positions will not be phase matched. This relative phase mismatch occurs, because the harmonic light's coherence length is finite. The above-described relation shows that the coherence length is finite, because the effective refractive indexes at frequencies "w" and "2w" are not equal due to dispersion.

Nevertheless, in a special laser cavity, the effective refractive index of one spatial cavity mode at frequency "w" can equal the effective refractive index of a different spatial cavity mode at a harmonic of the frequency "w", e.g., 2w, 3w, etc. In such a laser cavity, phase matching exists between harmonic light nonlinearly produced at different positions along the cavity's axis. Then, the amplitudes of harmonic light produced at different positions add without relative phase differences thereby producing a maximal total intensity for nonlinearly produced light.

Figure 9:
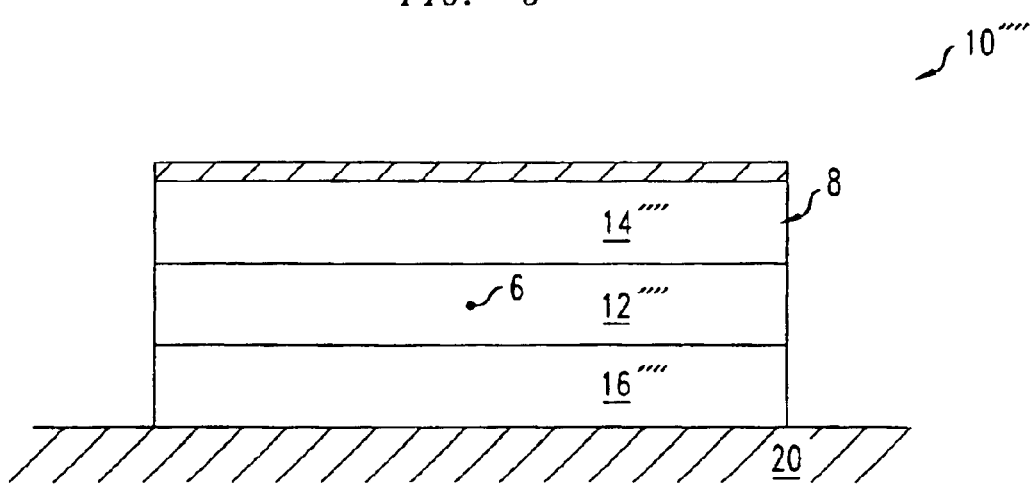
FIG. 9 is an end cross-sectional view of a monolithic optical source of phase matched harmonic light.

FIG. 9 shows a nonlinear light source 10'''' that implements phase matching for harmonic light. The source has a laser waveguide cavity that includes an optical core layer 12'''' and optical cladding layers 14'''', 16''''. The core layer 12'''' includes an alternating sequence of active and injector regions that produce stimulated emission light by the same processes as conventional quantum cascade lasers. The optical core 12'''' also resonantly absorbs light by two-photon processes if the energy of the two photons corresponds to twice the energy of a photon at the lasing frequency. Thus, the core layer 12'''' both produces laser light by stimulated emission and produces light at the $1^{st}$-harmonic of the lasing frequency by a resonant nonlinear optical process.

The index profile and cross-sectional dimensions of the waveguide cause the laser cavity to support a first spatial cavity mode at the lasing frequency and a different second spatial cavity mode at the $1^{st}$-harmonic of the lasing frequency. Furthermore, the cavity is designed so that the effective refractive index of the first spatial cavity mode at the lasing frequency is "approximately equal" to the effective refractive index of the second spatial cavity mode at the $1^{st}$-harmonic of the lasing frequency. For this reason, nonlinear optical processes, i.e. two-photon processes, produce $1^{st}$-harmonic light that is phase matched at different positions along central axis 6 of the optical laser cavity 12''''. The phase matching greatly increases the total intensity of produced $1^{st}$-harmonic light as compared to similar nonlinear optical light sources, e.g., source 10'' of FIG. 5B, in which phase matching does not occur.

Whether the effective refractive index of a first spatial cavity mode at the lasing frequency and the effective refractive index of a second spatial cavity mode at a harmonic of the lasing frequency are "approximately equal" may be determined from a value of a coherence length. The two effective refractive indexes are "approximately equal" if they lead to a coherence length that is longer than the laser cavity for harmonic light nonlinearly produced in the second spatial cavity mode by laser light in the first spatial cavity mode. Preferably, the coherence length is longer than twice the length of the laser cavity so that the harmonic light produced a different positions along the cavity's axis 6 constructively interferes. One of skill in the art would be able to determine the coherence length of light produced by a nonlinear process, i.e., harmonic or parametric light, from the effective refractive indexes of the spatial cavities modes for the laser light and the harmonic or parametric light being produced.

The core layer 12'''' has a miniband structure that is substantially identical to the miniband structure shown in FIG. 6B. The miniband structure includes a lowest miniband 32-1 and a higher miniband 34-1, and carrier transitions between the minibands 34-1 and 32-1 produce stimulated emission light during current pumping. The miniband structure also includes a triplet of minibands that includes higher minibands 38-1, 40-1 and the pumped miniband 34-1. In the triplet, the highest miniband 38-1 is shifted in energy by about $2E_1$ from the pumped miniband 34-1. Thus, carrier transitions from the higher miniband 38-1 to the pumped miniband 34-1 produce light at the 1$^{st}$-harmonic of the lasing frequency. Furthermore, excitations from the pumped miniband 34-1 lead to resonant absorption of photons at the lasing frequency and at twice the lasing frequency. Thus, the core layer 12'''' resonantly absorbs pairs of photons at the lasing frequency and nonlinearly produces light at the 1$^{st}$-harmonic of the lasing frequency. The core layer 12'''' functions both as a semiconductor structure for a quantum cascade laser and a nonlinear optical medium for resonantly producing light at the 1$^{st}$-harmonic of the lasing frequency.

FIGS. 10A–10E provide a detailed description of a sequence of the semiconductor layers of an exemplary mesa structure of the harmonic light source 10'''' of FIG. 9. The exemplary mesa structure is based on a GaInAs and AlInAs multi-layer. For each layer of the mesa structure, the description in FIGS. 10A–10E provides: dopant types (i.e., n-type (n), p-type (p), or intrinsic (i)), semiconductor alloy types, silicon (Si) dopant concentrations, and approximate layer thicknesses (i.e., ±10%). The exemplary structure has a total height of about 7.6323 $\mu$m above the InP substrate, a width of about 13 $\mu$m at the middle core layer 12'''', and a length of about of 0.5–3 mm, e.g., a 1.57 mm length. The exemplary structure has either the trapezoidal cross-section of FIG. 9, e.g., with sidewalls sloping at about 60 degrees, or a rectangular cross-section provided that the above-described 13 $\mu$m width for the core layer 12'''' is maintained.

FIGS. 10A and 10B–10D provide a detailed description of the top cladding layer 14'''' and bottom cladding layer 16'''', which include the respective layer sequences AA–II and KK–QQ. The detailed sublayer sequence for graded semiconductor layers CC, GG, and KK are shown in FIG. 10B. The detailed sublayer sequence for the graded semiconductor layers EE, II, and MM are shown in FIG. 10C. The detailed sublayer sequence for the graded semiconductor layer OO is shown in FIG. 10D.

FIG. 10B provides a detailed description of the 31 active units that make up the lasing core layer 12'''', i.e., multilayer JJ. The multilayer is a semiconductor structure that includes an alternating sequence of 31 active regions and injector regions. The detailed sublayer sequence for the separate active units is shown in FIG. 10B.

Figure 11:
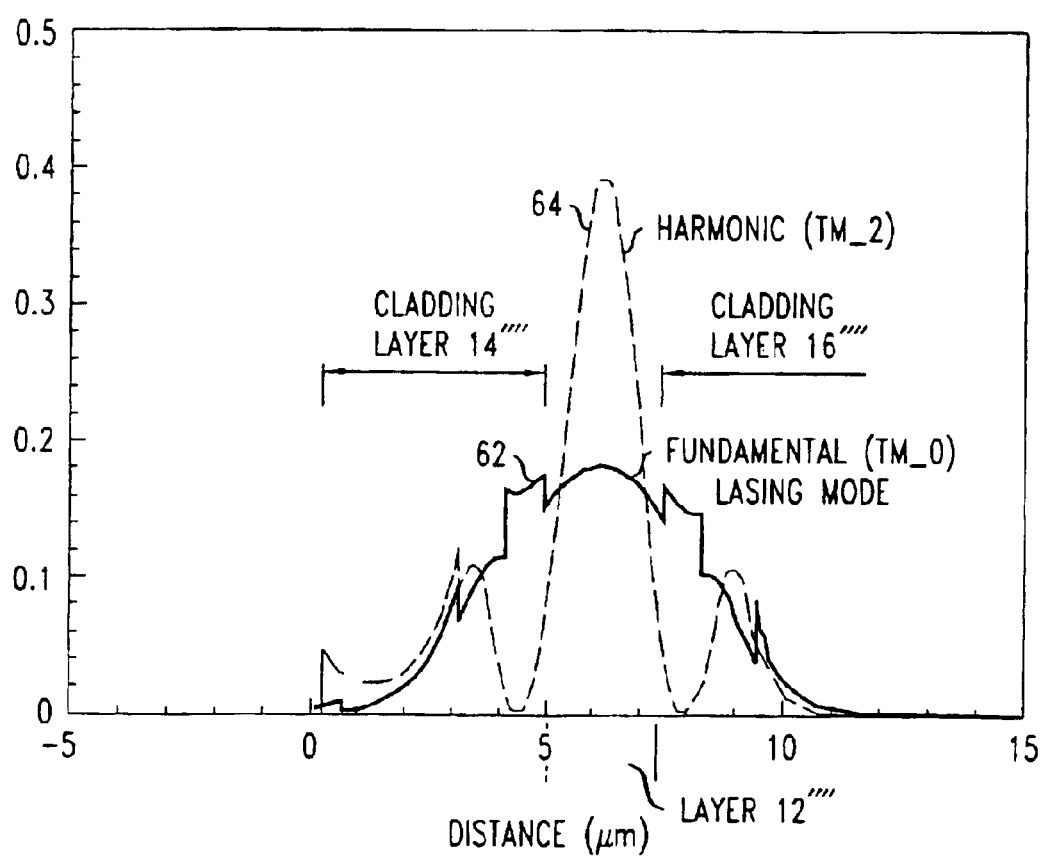
FIG. 11 shows predicted shapes and positions of the 9.51 μm spatial cavity lasing mode and the 4.75 μm $1^{st}$-harmonic spatial cavity mode in the monolithic optical source of FIGS. 10A–10E.

FIG. 11 shows predicted shapes and lateral positions of the cavity's lasing and 1$^{st}$-harmonic modes in the exemplary monolithic harmonic light source 10'''' of FIGS. 10A–10F, i.e., predictions are based on simulations of the cavity. The predictions show that the exemplary structure supports a fundamental spatial cavity mode 62 at the lasing frequency, i.e., a TM__0 mode (solid line). The predictions also show that the exemplary structure supports a second spatial cavity mode 64 at the 1$^{st}$-harmonic of the lasing frequency, i.e., a TM__2 mode (solid line). Furthermore, the predictions indicate that both the TM__0 and TM__2 cavity modes 62, 64 have approximately equal effective refractive indexes of about 3.26. That is, the TM__0 mode 62 has an effective index of 3.267, and the TM__2 mode 64 has an effective index of about 3.247. This close equality of effective refractive indexes, i.e., to better than 1%, should produce a coherence length for 1$^{st}$-harmonic light that is longer than the optical lasing cavity's length, in particular, when the changes to the refractive indices due to the lateral shaping of the cavity are added. Thus, the nonlinearly produced 1$^{st}$-harmonic light should be phase matched.

Other examples of the parametric light source 10 of FIG. 1 produce parametric light that is phase matched. In these embodiments, the parametric light produced at different positions along the axis of the optical lasing cavity, which is formed by the core layer 12 and the cladding layers 14, 16, is phase matched. In these exemplary parametric light sources, the lasing light having frequencies $w_1$ and $w_2$ is produced in first and second spatial laser cavity modes, and the parametric light having frequency $w_1+w_2$ is produced in a third spatial laser cavity mode. Furthermore, the optical laser cavity is configured so that the effective refractive index of the first laser cavity mode at the frequency $w_1$, i.e., $n_1(w_1)$, the effective refractive index of the second laser cavity mode at frequency $w_2$, i.e., $n_2(w_2)$, and the effective refractive index of the parametric light's cavity mode at frequency $(w_1+w_2)$, i.e., $n_p(w_1+w_2)$, produce a sufficiently long coherence length for the parametric light. A sufficiently long coherence length is longer than the length of the laser cavity. The coherence length for parametric light, $L_{c,p}$, satisfies: $L_{c,p} \propto [([(w_1+w_2)n_p(w_1+w_2)-(w_1)n_1(w_1)-(w_2)n_2(w_2))]^{-1}$. For the sufficiently long coherence length, parametric light produced at different positions in the laser cavity is effectively phase matched thereby increasing total output intensities for such light.

In various embodiments, the miniband levels that cause the resonant nonlinear optical production of parametric or harmonic light belong either to miniband structures of active regions, i.e., regions that produce laser light, or to miniband structures of transport regions, i.e., regions whose coupled quantum well regions do not produce laser light. Exemplary regions not producing laser light include injector regions, e.g., of layers 22' and 22'' of FIGS. 5A–5B, and intermediate transport superlattice layers, e.g., the layer 26 of FIG. 1.

In light of this disclosure, one of skill in the art would be able to make other monolithic sources for higher-order harmonic light and for parametric light at the difference of two lasing frequencies by obvious variations.

The various parametric nonlinear light sources described herein can provide sources for producing entangled photon pairs. Such sources are capable of providing transmitters for known schemes of producing secure optical transmission of data.

The various parametric and first harmonic nonlinear light sources described herein also provide tunable, narrow band sources in spectral ranges a typical for the primary light generating materials. For this reason, these sources have useful application in devices that include optical communication transmitters and trace gas sensors.

Other embodiments will be apparent to those of skill in the art in light of the summary, detailed description, figures, and claims.

What we claim is:

1. An apparatus, comprising:

a substrate;

a laser optical cavity being located over the substrate, the cavity having reflectors located at opposite ends thereof and a multi-layer structure located between the reflectors, the multi-layer structure comprising a first active semiconductor multi-layer and a second semiconductor multi-layer that is located laterally adjacent to the first active semiconductor multi-layer; and an electrode located over the substrate; and wherein the active semiconductor multi-layer comprises a sequence of quantum well structures that produce light of a lasing frequency in response to being electrically pumped by a pumping current from the electrode; and wherein the second semiconductor multi-layer comprises a sequence of quantum well structures configured both to resonantly absorb light of the lasing frequency via charge carrier excitations and to produce one of parametric light and harmonic light in response to absorbing light of the lasing frequency.

2. The apparatus of claim 1, wherein the second semiconductor multi-layer is capable of conducting a current for the electrical pumping of the first active semiconductor multi-layer.

3. The apparatus of claim 2, wherein the second semiconductor multi-layer has a partially filled subband during the electrical pumping.

4. The apparatus of claim 2, wherein the sequence of quantum well structures of the second semiconductor multi-layer is capable of resonantly optically absorbing light at a harmonic of the lasing frequency.

5. The apparatus of claim 1, wherein the sequence of quantum well structures of the second semiconductor multi-layer is capable of resonantly optically absorbing light at a harmonic of the lasing frequency.

6. The apparatus of claim 5, wherein the sequence of quantum well structures of the second semiconductor multi-layer is capable of resonantly optically absorbing light at the lasing frequency.

7. The apparatus of claim 1, wherein the second semiconductor multi-layer has a pair of subbands whose separation is approximately equal to an optical energy corresponding to a first harmonic of the lasing frequency.

8. The apparatus of claim 1, wherein the laser optical cavity comprises a third semiconductor multi-layer comprising a sequence of quantum well structures configured to produce laser light of a second lasing frequency in response to the electrical pumping; and wherein the sequence of quantum well structures of the second semiconductor multi-layer is configured to resonantly absorb light at the second lasing frequency via charge carrier excitations therein and to produce parametric light in response to absorbing light at the two lasing frequencies.

9. The apparatus of claim 8, wherein the second semiconductor multi-layer is configured to conduct a current for the electrical pumping of the first and third semiconductor multi-layers.

10. The apparatus of claim 9, wherein the second semiconductor multi-layer is capable of resonantly optically absorbing light at a sum of the two lasing frequencies.

11. The apparatus of claim 10, wherein the second semiconductor multi-layer has a pair of subbands whose separation is approximately an optical energy corresponding to a sum of the two lasing frequencies.

12. The apparatus of claim 1, wherein the laser cavity produces a lasing mode whose intensity maximum is positioned in the second semiconductor multi-layer.

13. The apparatus of claim 1, wherein the second semiconductor multi-layer produces the one of parametric and second harmonic light at a frequency corresponding to an energy of three or more lasing photons of the laser optical cavity in response to the electrical pumping.

14. The apparatus of claim 1, wherein the second semiconductor multi-layer is configured to produce light of a second lasing frequency in response to the electrical pumping; and wherein the second semiconductor multilayer is configured to produce parametric light at a sum of the first and second lasing frequencies.

15. The apparatus of claim 14, wherein the second semiconductor multi-layer is capable of resonantly optically absorbing light at a sum of the two lasing frequencies.

16. The apparatus of claim 1, wherein the second semiconductor multi-layer produces parametric light at a frequency that is a difference of two frequencies of laser light produced by the laser cavity.

17. An apparatus, comprising:

a substrate;

an electrode located over the substrate; and a laser optical cavity located over the substrate, the cavity having light reflectors located at opposite ends thereof and an active semiconductor multi-layer located between the light reflectors, the multi-layer structure comprising a sequence of quantum well structures, the sequence of quantum well structures producing light of a lasing frequency in response to being electrically pumped by a current from the electrode and being configured both to resonantly absorb light at a harmonic of the lasing frequency via charge carrier excitations therein and to produce light at the harmonic of the lasing frequency in response to the cavity lasing at the lasing frequency.

18. The apparatus of claim 17, wherein the sequence of quantum well structures of the semiconductor multi-layer is capable of resonantly optically absorbing light at the harmonic of the lasing frequency.

19. The apparatus of claim 17, wherein the semiconductor multi-layer has a pair of subbands whose separation is approximately equal to an energy corresponding to a first harmonic of the lasing frequency.

* * * * *